(12) United States Patent
Kotani et al.

(10) Patent No.: US 6,221,539 B1
(45) Date of Patent: Apr. 24, 2001

(54) MASK PATTERN CORRECTION METHOD AND A RECORDING MEDIUM WHICH RECORDS A MASK PATTERN CORRECTION PROGRAM

(75) Inventors: Toshiya Kotani, Sagamihara; Satoshi Tanaka, Kawasaki; Soichi Inoue, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/358,824

(22) Filed: Jul. 22, 1999

(30) Foreign Application Priority Data

Jul. 23, 1998 (JP) .................................................. 10-208057
May 20, 1999 (JP) .................................................. 11-140377

(51) Int. Cl.$^7$ .................................. G03F 9/00; G06F 3/00
(52) U.S. Cl. ........................................... 430/5; 395/500.22
(58) Field of Search .............................. 430/5, 322, 30, 430/394; 395/500.22

(56) References Cited

U.S. PATENT DOCUMENTS

| | | | |
|---|---|---|---|
| 5,631,110 | 5/1997 | Shioiri et al. | 430/5 |
| 5,900,340 | * 11/1999 | Reich et al. | 430/5 |
| 5,991,006 | * 11/1999 | Tsudaka | 430/5 |

\* cited by examiner

*Primary Examiner*—S. Rosasco
(74) *Attorney, Agent, or Firm*—Finnegan, Henderson, Farabow, Garrett & Dunner, L.L.P.

(57) ABSTRACT

All edge positions constituting a first mask pattern are shifted by a predetermined change amount, to obtain a second mask pattern. A first finished plan shape transferred by the fist mask pattern and a second finished plan shape transferred by the second mask pattern are obtained by a calculation. Coefficients, which are obtained by respectively dividing dimensional differences between the edge positions of the first and second finished plan shapes by the change amount, are respectively calculated and assigned for edges. A corrected pattern is prepared by shifting the edge positions of the first mask pattern in accordance with magnitude of division of differences between a design pattern and the first finished plan shape by the coefficients assigned to the edges.

14 Claims, 14 Drawing Sheets

MASK PATTERN CORRECTION METHOD AND A RECORDING MEDIUM WHICH RECORDS A MASK PATTERN CORRECTION PROGRAM

BACKGROUND OF THE INVENTION

The present invention relates to a mask pattern correction method useful for correcting a pattern edge position in an optical proximity effect, and a recording medium which records the mask pattern correction program.

In recent years, the semiconductor manufacturing techniques have extremely progressed, and semiconductor devices having a minimum processible size of 0.25 μm have been manufactured in these days. This fine downsizing of devices is realized by rapid progress of a fine pattern forming technique called an optical lithography technique. The optical lithography means a series of steps of: forming a mask from a design pattern of an LSI; irradiating light on the mask to expose a resist coated on the wafer in accordance with a pattern drawn on the mask by a projection optical system; and developing the resist based on the dose distribution thereby to form a resist pattern on the wafer. By etching lower layers with use of the resist pattern formed through the optical lithography steps, as a mask, an LSI pattern is formed on the wafer.

In a generation in which the pattern size was sufficiently large compared with the resolution limit of a projection optical system, the plan shape of the LSI pattern desired to be formed on the wafer was directly drawn as a design pattern. Further, a mask pattern as same as the design pattern was prepared. The mask pattern thus obtained was transferred onto a wafer by a projection optical system. In this manner, a pattern substantially similar to the design pattern was formed on the wafer.

However, as the patterns have come to become smaller, an optical proximity effect has come to appear clearly. Due to this optical proximity effect, the pattern formed on a wafer with use of a mask prepared in compliance with a design pattern differs from the design pattern, accompanying remarkable bad influences.

For example, in case of a line/space (L/S) pattern, the finished line widths in an isolated pattern and a dense pattern differ from each other. Similarly, in case of a two-dimensional pattern for a contact hole or the like, the finished plan shape of the pattern differs depending on the difference in the degree of pattern density or pitch. Therefore, the dose amounts used for finishing the isolated pattern and dense pattern in compliance with desired dimensions vary for every pattern. As a result, it is impossible to attain an exposure margin necessary for the lithography steps.

Hence, there has been a proposal for a method for moving pattern edge positions such that the finished plan shape exposed at a certain predetermined dose amount does not depend on the density or pitch of the pattern but is finished within certain predetermined dimensions. This is called an optical proximity effect correction, and movement amounts of pattern edge positions are optimized in the following procedures (1) to (3), in many cases.

(1) A dimensional difference $\Delta x_{i1}$ between an edge position of a desired pattern, and an edge position of a finished plan shape, which is obtained by subjecting the mask pattern to an image intensity calculation, is calculated. In this case, i denotes an appended character corresponding to the edge, and the numeral following the character figure indicates the number of repetitive calculations.

(2) As for the dimensional difference $\Delta_{xi1}$ at each edge position, each edge position of the mask pattern indicated in (1) is moved by the length $\Delta C = \Delta x_{i1}/M$ regulated by a constant M determined to be uniform for each edge, to prepare a corrected mask pattern.

(3) The calculations indicated in (1) and (2) are repeated until a dimensional difference $\Delta x_{in}$ between the edge position of the finished plan shape of the corrected mask pattern prepared in (2) and an edge position of a desired pattern becomes to be equal to a predetermined allowable value or less.

However, the constant M is a value which varies for each edge in complicated device pattern. Therefore, if a constant M is used uniformly for each edge, a repetitive calculation need to be carried out for a large number of times, so a long time is required. If the above-mentioned value of M and a value of M which is actually obtained by an edge greatly differs from each other, the dimensional difference Δxin obtained by calculations repeated for n times oscillates between + and − directions, so the calculations cannot be converged. Therefore, the movement amount of the edge position cannot be optimized in several cases due to the pattern layout.

FIG. 1 shows the relationship between the number of times of correction calculations and the correction results where corrections were made in accordance with the conventional procedures described above. The lateral axis represents the number of times for which calculations were repeated, while the longitudinal axis represents the mask dimension. In case of a aerial image calculation, the mask dimension value oscillates for every time of correction calculation. When calculations were made in consideration of development process in addition to the aerial image calculation, the mask dimension value is diverged. Thus, in neither the aerial image calculation nor the aerial image calculation considering development, the mask dimension value was converged.

BRIEF SUMMARY OF THE INVENTION

The present invention has an object of providing a mask pattern correction method and a mask pattern capable of greatly reducing the time required for correction and enabling correction with high accuracy.

Also, the present invention has another object of providing a recording medium which records a correction program capable of greatly reducing the time required for correction and enabling correction with high accuracy.

According to an aspect of the present invention, there is provided a mask pattern correction method used for forming a design pattern on a wafer by a projection optical system, comprising: a first step of preparing a second mask pattern by shifting each of positions of edges forming a first mask pattern by a predetermined change amount; a second step of obtaining a first finished plan shape transferred by the first mask pattern, and a second finished plan shape transferred by the second mask pattern, by means of a calculation or experiment; a third step of calculating coefficients obtained by dividing a dimensional difference between edge positions of corresponding edges of the first and second finished plan shapes, by the change amount, for every edge, and assigning the coefficients to the edges; and a fourth step of preparing a corrected pattern by shifting the edge positions of the edges of the first mask pattern in accordance with magnitude of division of differences between the design pattern and the first finished plan shapes, by the coefficients assigned to the edges.

According to another aspect of the present invention, there is provided a mask pattern correction method used for forming a design pattern on a wafer by a projection optical system, wherein a corrected pattern is prepared by shifting edge positions of the first mask pattern for edges such that first dose amounts at which edge positions of a finished plan shape transferred by a first mask pattern respectively become equal to edge positions of the design pattern becomes equal to a predetermined reference dose amount.

The predetermined reference dose amount expresses an dose amount at which a plan shape transferred by a mask pattern is finished as desired. It is desirable that the mask pattern is a pattern having the smallest exposure margin among all patterns existing in one layer.

For example, in case where a gate layer and a wiring layer of a DRAM is supposed, it is desirable that the dose amount at which a line and space pattern called cells is finished as desired is set to the reference dose amount.

Also, the present invention which relates to a method can be realized as a recording medium which is readable by a computer and which records a mask pattern correction program for realizing the function corresponding to the present invention.

In the present invention, change amounts of edge positions on a wafer after transfer when the edge positions are slightly changed, and the shift amounts of the edge positions are determined respectively for the coefficients obtained by the change amounts. In this manner, dimensional differences respectively between the edge positions of a corrected pattern and the edge positions of a desired pattern are minimized, i.e., the shift amounts of the edge positions of a desired pattern are respectively optimized for the edges. Therefore, predetermined accuracy can be obtained by a small number of repetitions of calculations, so a corrected pattern can be prepared in a shorter time than in a conventional method.

Also, according to another aspect of the invention, dose amounts at which edge positions of a finished plan shape before change of edge positions become equal to those of a design pattern and dose amounts at which edge positions of a finished plan shape after the change of the edge positions also become equal to those of the design pattern are obtained. The edges of the mask pattern are respectively shifted in correspondence with the dose amounts for the edges, to prepare a corrected pattern. In this case, since the edge shift amounts of the corrected pattern are also respectively optimized for the edges, predetermined accuracy can be obtained by a small number of repetitions of calculations, so a corrected pattern can be prepared in a shorter time than in a conventional method. In addition, even a pattern which cannot be calculated with a conventional method can be corrected with high accuracy.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

First Embodiment

Figure 2:
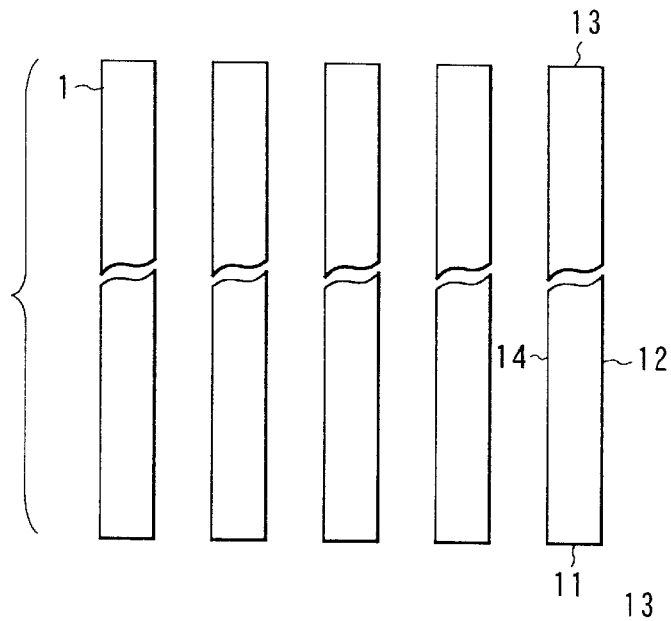
FIG. 2 is a view for explaining a mask pattern correction method according to the first embodiment of the present invention.

FIGS. 2 to 8 are view for describing a method of correcting a mask pattern according to the first embodiment of the present invention. In FIG. 2, the reference 1 denotes a mask pattern which forms a reference for obtaining a desired mask pattern. The mask pattern 1 is a pattern which is obtained by directly magnifying a design pattern maintaining similarity in shape, and is also an L/S pattern of 1:1 having a line width 0.18 μm calculated on a wafer. This mask pattern 1 is a rectangle with four edges 11 to 14. In the following embodiments, the design pattern means a pattern to be formed on a wafer.

Figure 3:
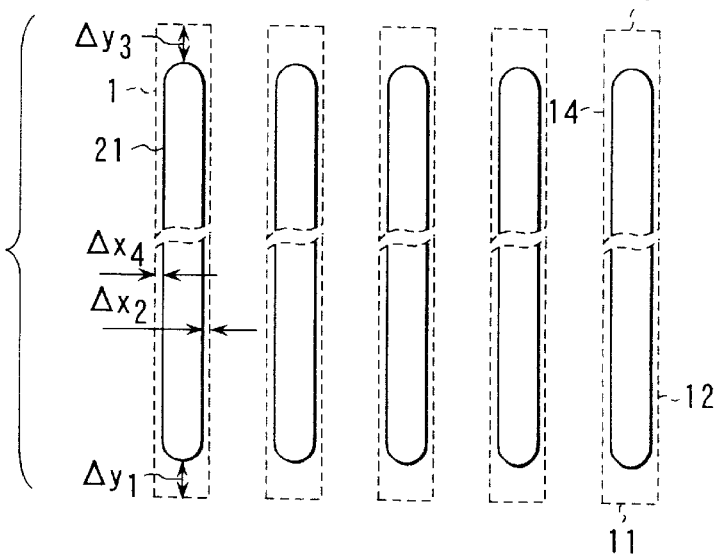
FIG. 3 is a view showing a finished plan shape according to the embodiment.

A finished plan view obtained from an experiment or calculation with use of this mask pattern 1 is shown in FIG. 3. In FIG. 3, the reference 21 denotes a finished plan shape transferred onto a wafer. Together with the finished plan shape 21, a mask pattern 1 calculated on a wafer is indicated by a broken line. Since the mask pattern is prepared with fidelity to a design pattern, the design pattern is considered to be the mask pattern calculated on a wafer. As can be seen from FIG. 3, the edge position of the finished plan shape 21 is positioned inwards from the edge position of the mask pattern 1 by $\Delta x_i$ (i corresponds to the edge number) in the x-direction and by $\Delta y_i$ in the y-direction.

In the following, a method of correcting the mask pattern 1 will be specifically explained with reference to a flowchart shown in FIG. 4.

Figure 4:
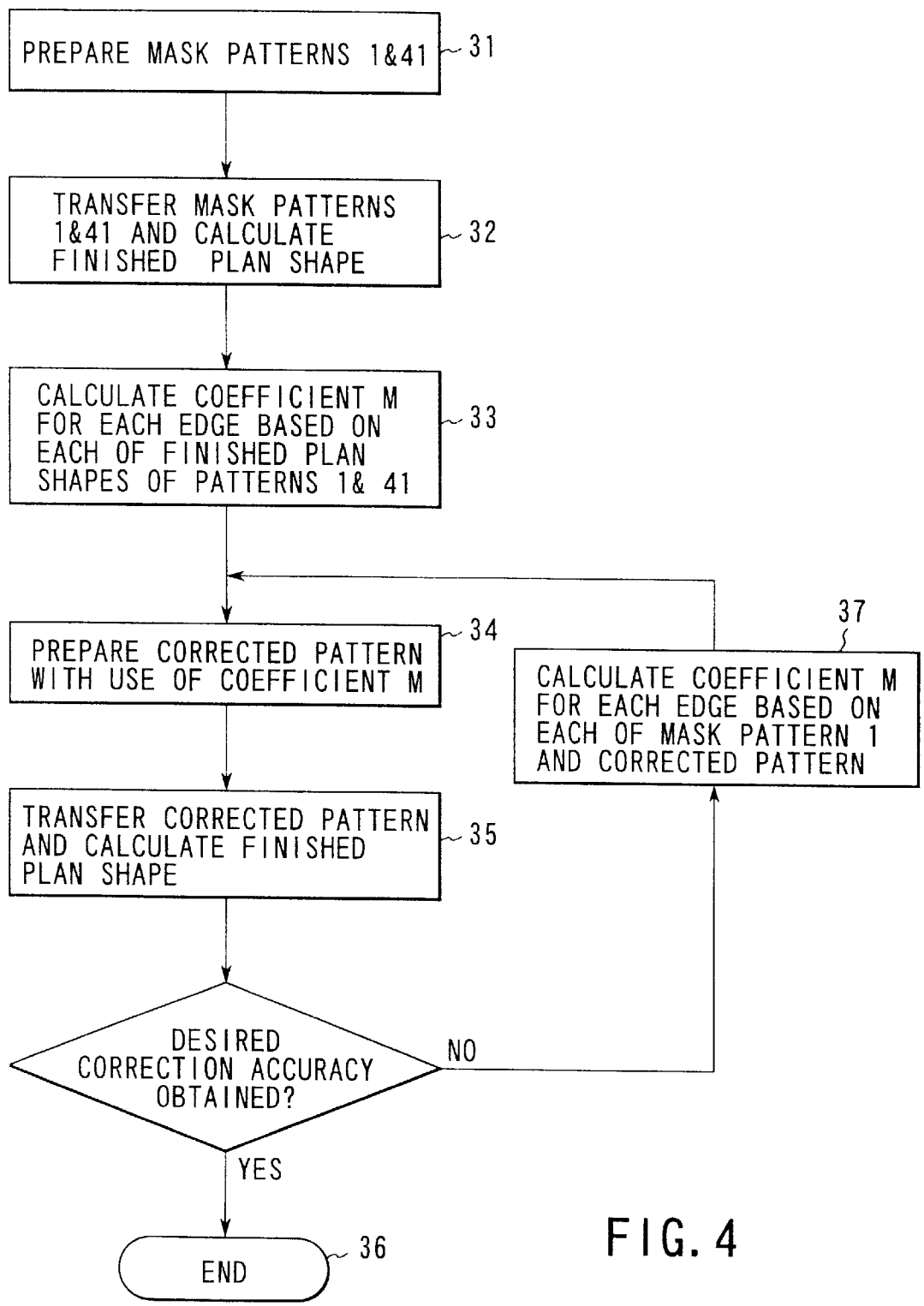
FIG. 4 is a flowchart showing the mask pattern correction method according to the embodiment.
Figure 5:
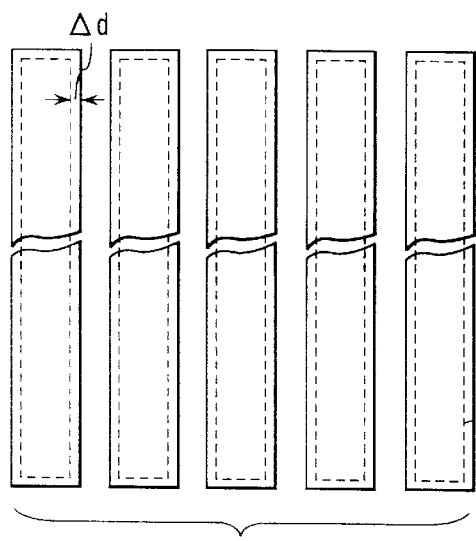
FIG. 5 is a view showing a slightly changed mask pattern according to the embodiment.
Figure 6:
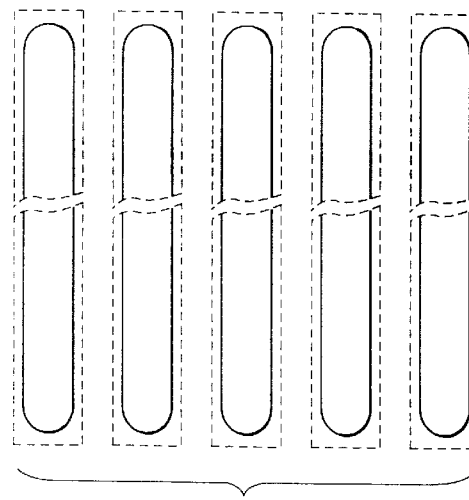
FIG. 6 is a view showing a finished plan shape depending on the slightly changed mask pattern according to the embodiment.

At first, as shown in FIG. 4, a mask pattern 1 obtained by directly magnifying a design pattern with maintaining the similarity in shape is prepared (31). Next, as shown in FIG. 5, a mask pattern 41 is prepared by uniformly shifting outwards the edges 11, 12, 13, and 14 of the mask pattern 1 by a small amount $\Delta d$, to enlarge the contour. Further, with use of the mask patterns 41, a finished plan shape 42 is obtained by an experiment or calculation (32). FIG. 6 shows the plan shape 42 thus obtained, along with the mask pattern 41.

Figure 7:
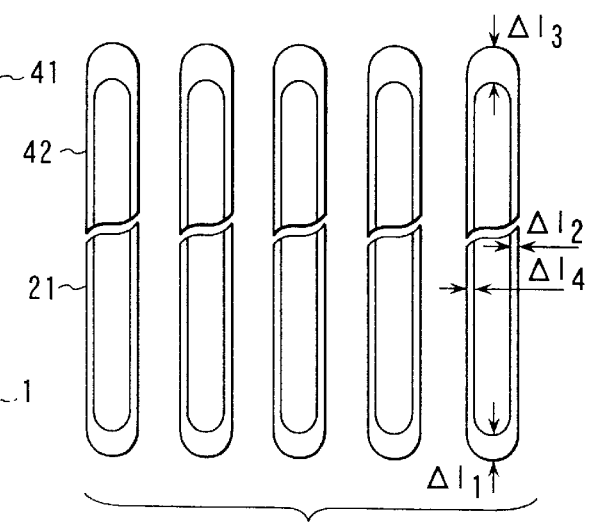
FIG. 7 is a view showing finished plan shapes depending on slightly changed and unchanged ones according to the embodiment.

Next, as shown in FIG. 7, based on the finished plan shapes 21 and 42 obtained from the mask patterns 1 and 41, the dimensional difference $\Delta I_i$ is obtained at the center position of each edge. The dimensional difference $\Delta I_i$ of each edge is divided by a small change amount $\Delta d$, to calculate a correction coefficient $Mi=\Delta I_i/\Delta d$ for each edge. Further, the correction coefficients are respectively assigned to the edges (33). Further, based on the dimensional differences $\Delta X_i$ and $\Delta Y_i$ between the design pattern and the finished plan shape 21, with use of the below equation (1) and (2), the shift amounts $\Delta m_{xi}$ and $\Delta m_{yi}$ of each edge are determined with respect to the mask pattern 1.

$$\Delta m_{xi} = \Delta X_i / Mi \qquad (1)$$

$$\Delta m_{yi} = \Delta Y_i / Mi \qquad (2)$$

Further, a corrected pattern is prepared in which each edge position of the mask pattern 1 is shifted by the shift amounts $\Delta m_{xi}$ and $\Delta m_{yi}$ (34). With use of this corrected pattern, a finished plan shape is obtained from an experiment or calculation (35).

Figure 8:
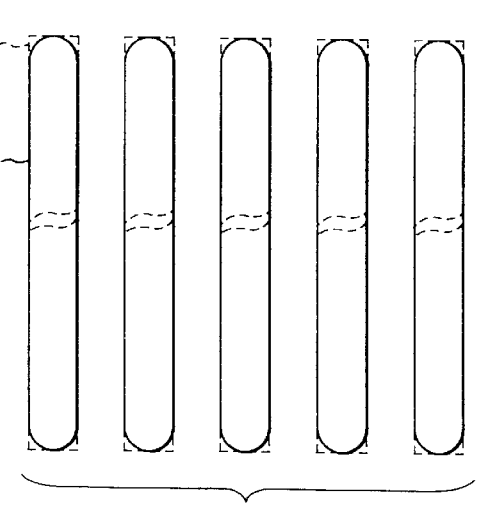
FIG. 8 is a view showing a finished plan shape depending on a corrected pattern according to the embodiment.

FIG. 8 shows schematic views of the finished plan shape 61 depending on the corrected pattern obtained by the above-described method and the mask pattern 1 equivalently calculated on a wafer. The mask pattern 1 shown in FIG. 8 is the design pattern itself. The finished plan shape 61 attains a desired correction accuracy as shown in FIG. 8 and thus could be finished to be substantially equivalent to the design pattern. Preparation of the corrected pattern is thereby completed (36). Note that the calculation was diverged so correction could not be made in case of a conventional method, i.e., where the mask pattern 1 was corrected with a correction coefficient $M_i=1$ for each edge.

If predetermined correction accuracy cannot be obtained by making thus a correction for one time, correction is repeatedly made with use of the same method as described above (37) and a much precise corrected pattern can be obtained. Specifically, it suffices that the following step is repeatedly carried out. In the step, dimensional differences $\Delta X_{i2}$ and $\Delta Y_{i2}$ at each edge center position between the design pattern and the finished plan shape 61 after correction (where i denotes the edge position and the following character denotes the number of times of repetitive calculations) are calculated, and each edge position of the corrected pattern is shifted further by the magnitudes obtained by dividing $\Delta X_{i2}$ and $\Delta Y_{i2}$ by Mi.

Thus, according to the present embodiment, the shift amounts of the pattern edge positions in optical proximity effect correction can be optimized with high accuracy in a short time period by a small number of calculations. In addition, even a pattern layout which diverges calculations and cannot be corrected with a conventional method can be corrected. As a result of this, a possibility is found in that even a pattern layout such as a supplemental pattern or the like, which has been considered as requiring two-dimensional correction, can be corrected merely by shifting the edge positions, so various advantages can be attained in view of the mask drawing data amount, the mask drawing accuracy, and the like.

Second Embodiment

Figure 9:
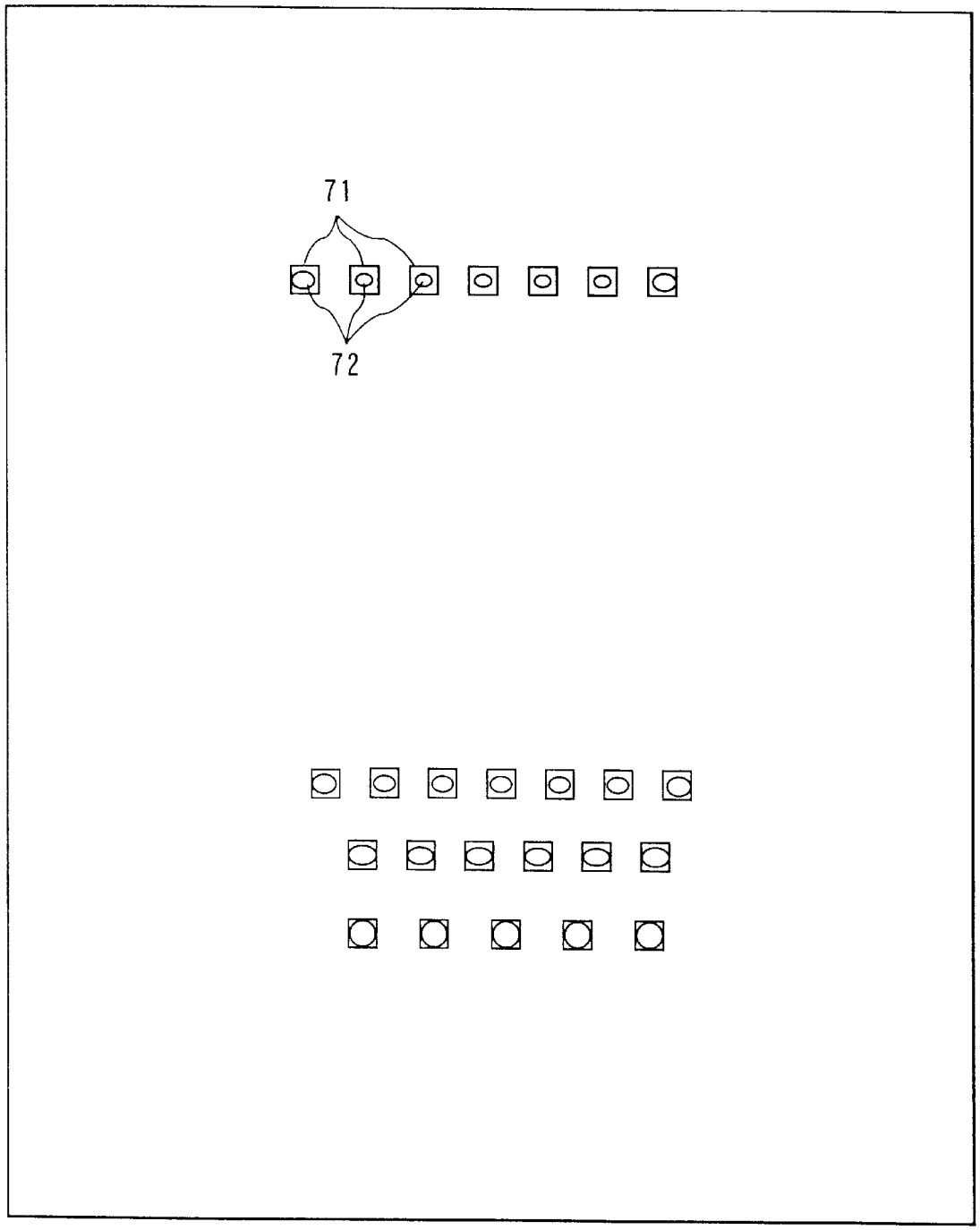
FIG. 9 is a view for explaining the mask pattern correction method according to the second embodiment of the present invention.
Figure 10:
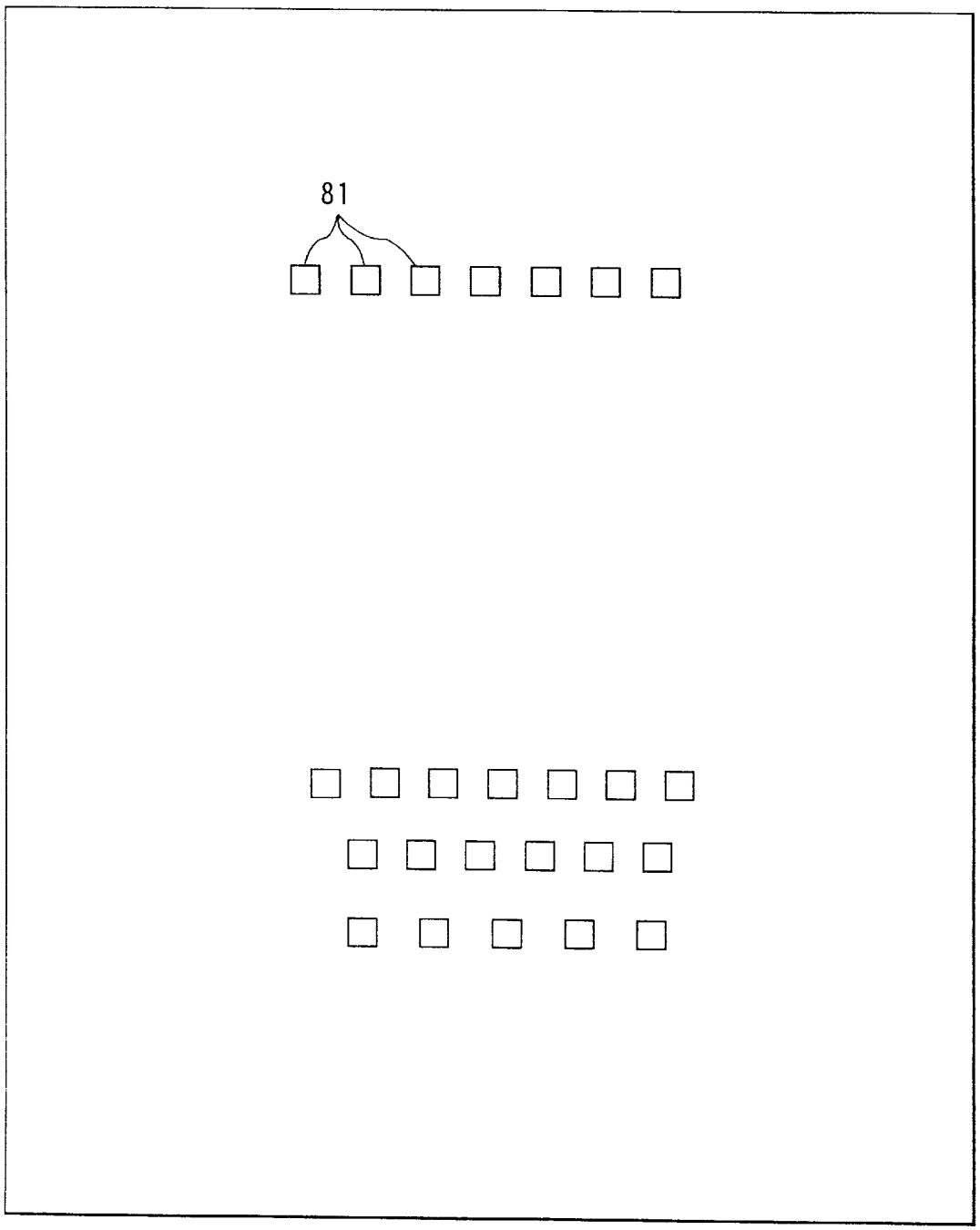
FIG. 10 is a view showing a corrected pattern according to the embodiment.
Figure 11:
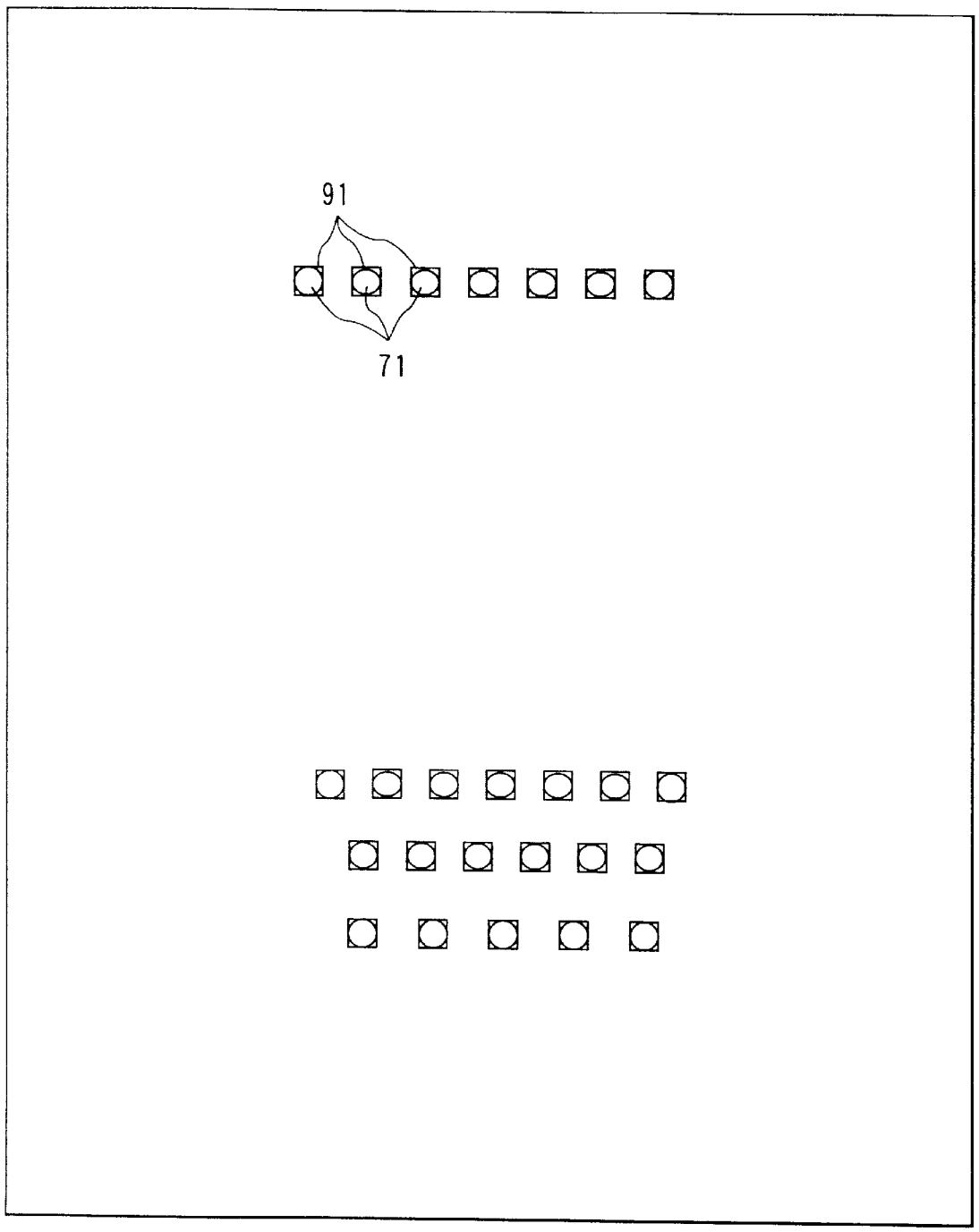
FIG. 11 is a view showing a finished plan shape according to the embodiment.

FIGS. 9 to 11 are views for describing a mask pattern correction method according to the second embodiment of the present invention. Although the correction method is common to that of the first embodiment, the target to be corrected differs therefrom. The target to be corrected in the present embodiment is a contact hole pattern. Note that detailed explanation of portions common to the first embodiment will be omitted herefrom.

In FIG. 9, the reference 71 denotes a mask pattern which serves as a reference for obtaining a desired mask pattern. This mask pattern 71 is a pattern of contact hole, which is obtained by directly magnifying a design pattern with maintaining the similarity in shape and is equivalently calculated on a wafer in this figure. The reference 72 denotes a finished plan shape obtained from an experiment or calculation with use of the mask pattern 71. The length of each edge of the mask pattern 71 is 0.20 μm equivalently calculated on the wafer. The inside of the mask pattern 71 is a transparent part (with a transparency 100%), and the outside of the mask pattern is formed of a light shielding material Cr (with a transparency 0%). With use of this mask pattern 71, exposure is performed by normal lighting with an exposure wavelength λ=0.248 μm, a numerical aperture NA=0.6, and an partial coherence σ=0.3 of a lighting optical system, and defocusing is performed by 0.3 μm, to obtain the finished plan shape 72.

The finished plan shape 72 is finished to be smaller than the mask pattern 71 equivalently calculated on the wafer. Therefore, correction is carried out in the same method as indicated in the first embodiment. Specifically, a mask pattern is prepared by slightly shifting the edge positions of the mask pattern 71. Further, a finished plan shape depending on the mask pattern is obtained, and correction coefficients M are respectively calculated from dimensional differences of the edges. Further, a corrected pattern is obtained based on the correction coefficients M. This calculation is then repeated for two times, to make correction for total three times. A corrected pattern 81 is thus prepared.

The corrected pattern 81 thus obtained is shown in FIG. 10. FIG. 11 shows a finished plan shape 91 obtained by subjecting the corrected pattern 81 to image intensity calculation and the mask pattern 71. The mask pattern shown in FIG. 11 is a design pattern itself. As can be seen from FIGS. 9 and 11, the plan shape 91 after correction is more similar to the plan shape of the mask pattern 71 equivalently calculated on the wafer than the finished plan shape 72 before correction. For example, if the allowable dimensional difference between the pattern 71 and the finished plan shape 91 is set to 0.20 μm±10% or less, the repetitive calculation as described above is sufficient. To prepare a corrected pattern with higher accuracy, the correction accuracy may be improved by further repeating the calculation with respect to the corrected pattern 81.

As explained above, according to the present embodiment, it has been found that a corrected pattern with high accuracy can be prepared by less repetitions of calculation in case of a contact hole pattern.

Third Embodiment

Figure 12A:
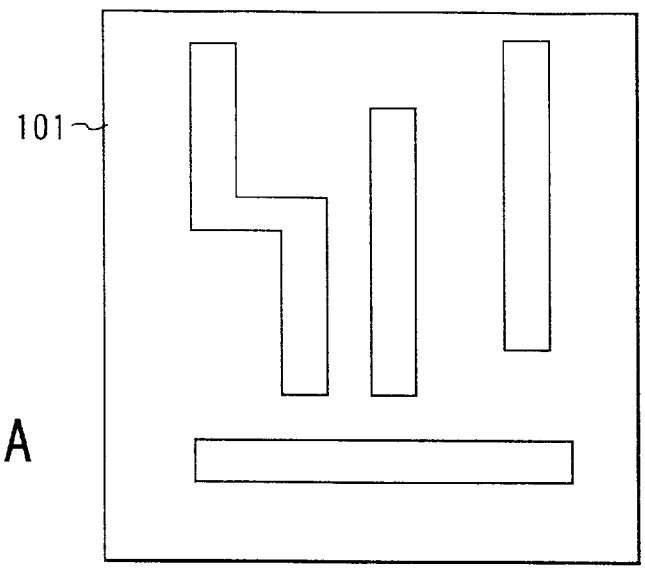
FIG. 12A is a view showing a design pattern of an actual device as a target of the third embodiment of the present invention.
Figure 12B:
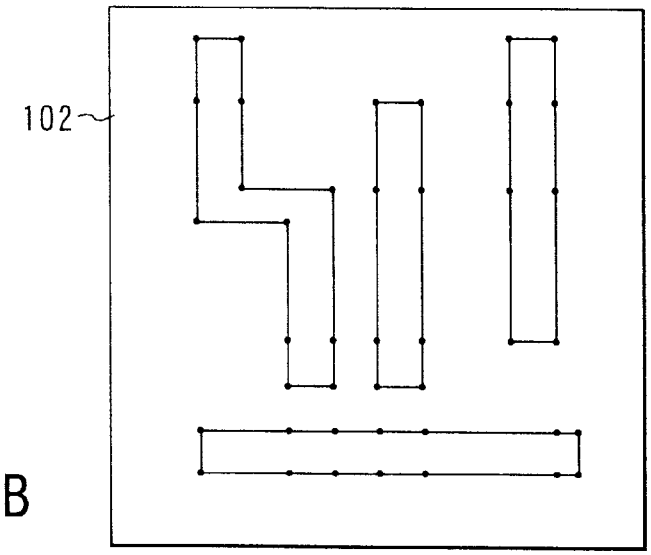
FIG. 12B is a view showing a divided mask pattern according to the embodiment.

FIGS. 12A and 12B are views for describing a mask pattern correction method according to the third embodiment of the present invention. The present embodiment shows a case where an actual device pattern is corrected. In the following, the method therefor will be explained with reference to FIGS. 12A and 12B.

FIG. 12A shows a design pattern of an actual device as a target in the present embodiment. The reference 101 denotes the design pattern. This design pattern 101 is magnified maintaining the similarity in shape, to prepare a mask pattern. Further, on design data, all the edges constituting this mask pattern are previously divided into lengths each of which is a multiple of the drawing grid width of the drawing device by any integral. The mask pattern thus divided is shown in FIG. 12B. In FIG. 12B, circle dots pointed on the edges of the mask pattern 102 indicate points where edges are divided. In the present embodiment, dimensional differences $\Delta I_i$ and $M_i$ are obtained for every edge between the circle dots.

At this time, by using a correction method similar to the first and second embodiments, no limitations need to be applied at all to division of edges. Therefore, the edges may be divided to be short or long. FIG. 12B shows an example in which edges are divided at the portions where the pattern layout changes in the peripheral portions of the edges.

After thus dividing the edges, a mask pattern in which all the edges are uniformly shifted slightly by Δd is prepared, and a finished plan shape is obtained for each pattern, like in the first embodiment. Further, dimensional differences are respectively calculated at the center positions of edge sectors of divided edges in each finished plan shape. By dividing the dimensional differences by Δd, coefficients are respectively calculated for the edge sectors. These coefficients are then assigned to the edge sectors obtained by previously dividing the edges.

Further, the sizes, obtained by dividing the dimensional differences between the edge center positions of the mask pattern 102 equivalently calculated on a wafer and those of the finished plan shape by coefficients corresponding the edges, are defined to be the shift amounts for the divided edges. The shift amounts thus calculated are added to the mask pattern 102, thereby to correct the mask pattern 102. If correction with much higher accuracy is required, calculation may be repeatedly performed like in the first embodiment.

After thus correcting the mask pattern 102 shown in FIG. 12B, a corrected photomask was prepared and exposure and development were carried out. The finished plan shape was then measured, and it was found that a resist pattern as substantially desired could be prepared.

From the above, it can be found that effective correction can be made with less repetitions of calculation by previously dividing edges in case of correcting a complicated wiring pattern used for an actual device pattern or a line pattern such as a gate pattern or the like.

Fourth Embodiment

Figure 13:
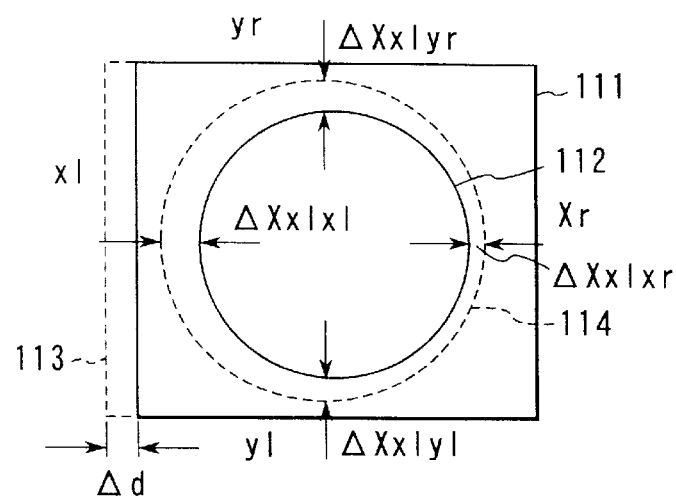
FIG. 13 is a view for explaining the mask pattern correction method according to the fourth embodiment of the present invention.
Figure 14:
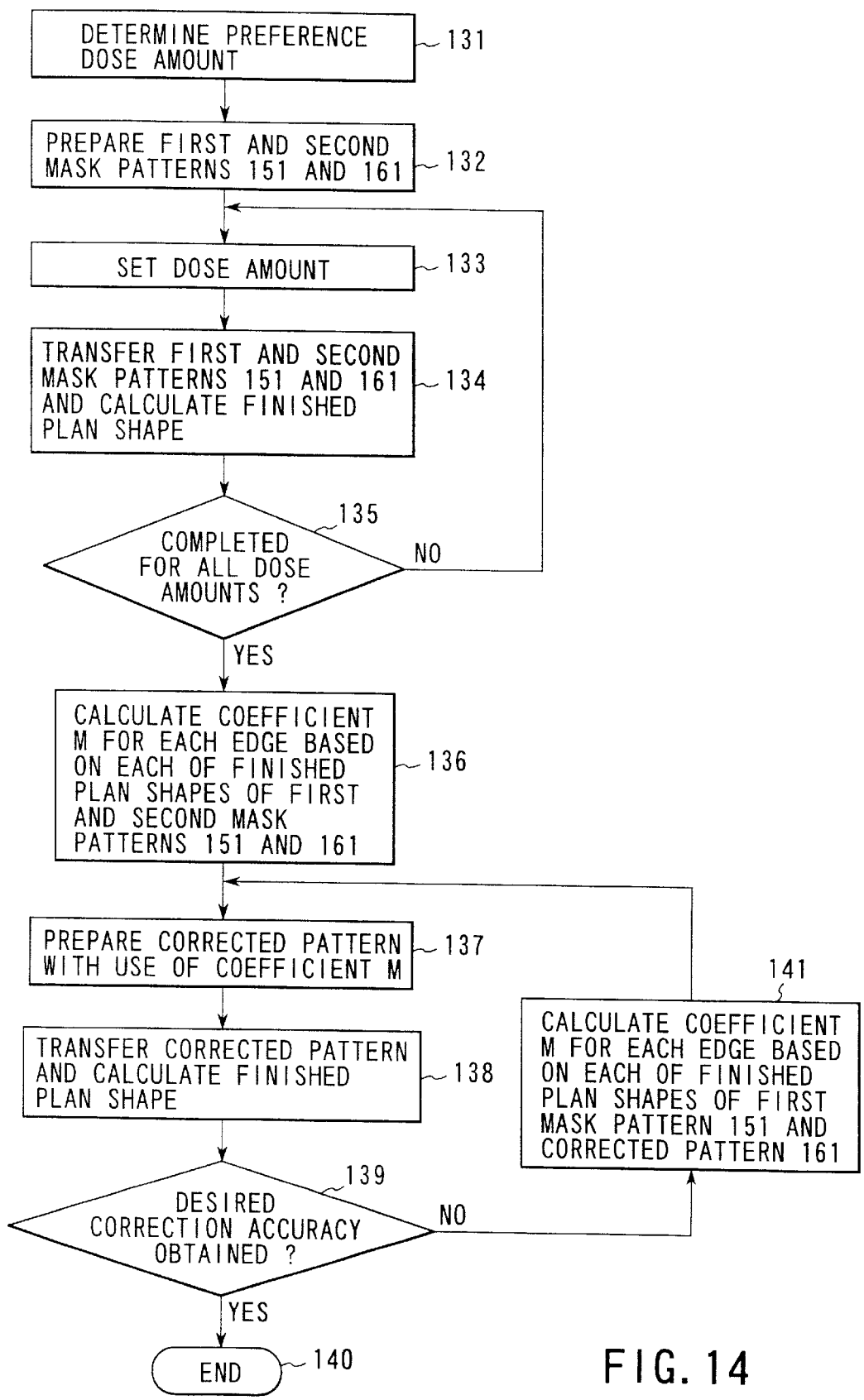
FIG. 14 is a flowchart showing the mask pattern correction method according to the fifth embodiment of the present invention.

The fourth embodiment of the present invention shows a more specific form of the method of correcting a contact hole pattern according to the second embodiment. In the following, the mask pattern correction method according to the present embodiment will be explained with reference to FIG. 13.

In the present embodiment, the following (3) is an equation showing the correction coefficients M arranged in form of a matrix when a corrected pattern is obtained with respect to a contact hole pattern.

$$\begin{bmatrix} \Delta l_{yl} \\ \Delta l_{xr} \\ \Delta l_{yr} \\ \Delta l_{xl} \end{bmatrix} = \begin{bmatrix} M_{ylyl} & M_{xryl} & M_{yryl} & M_{xlyl} \\ M_{ylxr} & M_{xrxr} & M_{yrxr} & M_{xlxr} \\ M_{ylyr} & M_{xryr} & M_{yryr} & M_{xlyr} \\ M_{ylxl} & M_{xrxl} & M_{yrxl} & M_{xlxl} \end{bmatrix} \begin{bmatrix} \Delta m_{yl} \\ \Delta m_{xr} \\ \Delta m_{yr} \\ \Delta m_{xl} \end{bmatrix} \quad (3)$$

In the above equation, the correction coefficient $M_{ij}$ represents a correction coefficient with respect to the j-direction in case where the edge i is shifted. $\Delta m_i$ represents a shift amount of the edge i, and $\Delta I_i$ represents a dislocation from a desired dimension. That is, the correction coefficient $M_{ij}$ calculated in the present embodiment is a value taking into consideration the influences effected by shifts of an adjacent edge and an opposite edge in case where the edges separately shift.

A correction method using the plurality of correction coefficients M will be explained with reference to FIG. 12B.

At first, dimensional differences $\Delta I_i$ between the edge center positions of the design pattern and the plan shape 112 of the mask pattern 111 are respectively obtained for the edges. Next, a mask pattern 113 is prepared in which the edge x1 of the mask pattern 111 is expanded by a small length Δd. Further, a finished plan shape 114 depending the mask pattern 113 is obtained from an experiment or calculation.

Next, the correction coefficient $M_{xlxl}$ is obtained from the plan shapes 112 and 114 thus obtained. Where the amount by which the finished plan shape 114 is shifted in the direction of the edge x1 from the finished plan shape 112 is set to be $\Delta X_{x1x1}$, the correction coefficient $M_{x1x1}$ is obtained by $M_{x1x1} = \Delta X_{x1x1}/\Delta d$.

Also, to calculate the correction coefficient $M_{x1y1}$, the change amount $\Delta X_{x1y1}$ of the finished plan shape 114 in the direction of y1 when the edge x1 is slightly shifted by $\Delta d$. With use of this change amount $\Delta X_{x1y1}$, the correction coefficient becomes $M_{x1y1} = \Delta M_{x1y1}/\Delta d$.

Similarly, each component of the correction coefficient $M_{ij}$ can be calculated by calculating the shift amount for every edge of the finished plan shape when the edges are changed.

Next, from each component of the correction coefficient $M_{ij}$ thus obtained, the change amount by which the mask pattern 111 should be shifted is obtained. If the change amount of each edge to be shifted is defined as $\Delta m_i$, the relationship between the dimensional difference $\Delta I_i$ and the change amount $\Delta m_i$ will be as described in the equation (3). As can be seen from the equation (3), by calculating an inverse matrix of the correction coefficients M, $\Delta m_i$ is obtained for every edge. Further, a corrected pattern is completed by adding the obtained $\Delta m_i$ obtained to every edge of the mask pattern 111 as a reference.

In case where the corrected pattern cannot attain predetermined accuracy, a corrected pattern with higher accuracy can be obtained by repeating correction in the same manner as described in the first embodiment.

Thus, according to the present embodiment, even in case of a pattern such as a contact hole pattern or the like in which a change of a mask pattern in the longitudinal direction influences a change of a finished plan shape in the lateral direction, each edge can be corrected in a relatively short time with high accuracy. Of course, this is not limited to a contact hole but this mask pattern correction method is applicable to any kind of pattern as far as mask changes in the longitudinal and lateral directions have a correlation with each other.

The present invention is not limited to the above embodiment. The above embodiment is merely an example where the present invention is applied. The present invention can be widely applied to other pattern correction methods which involve shifts of pattern edge positions, in addition to the embodiment described herein.

Fifth Embodiment

FIGS. 14 to 23 explain a mask pattern correction method according to the fifth embodiment of the present invention. Although the first to fourth embodiments have cited cases where a corrected pattern is obtained from dimensional changes under condition of a constant dose amount, the following embodiment shows a case where a corrected pattern is obtained from differences of dose amounts under condition of constant dimensions. Explanation will be made below in accordance with a flowchart shown in FIG. 14.

Figure 15:
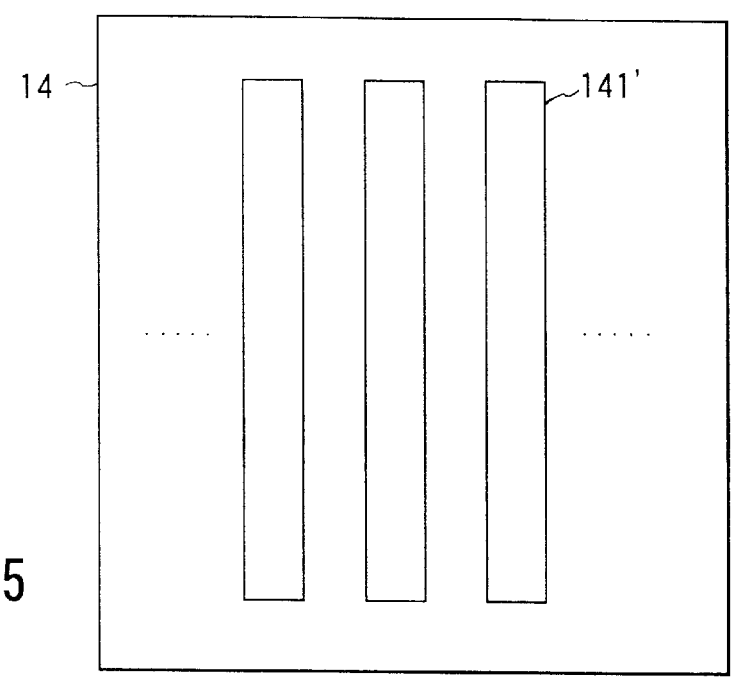
FIG. 15 is a view showing the structure of a mask used for determining a reference dose amount in the mask pattern correction method according to the embodiment.

At first, an dose amount as a reference for preparing a corrected pattern (which will be hereinafter called a reference dose amount $I_e$) is determined (131). FIG. 15 shows a mask used for determining the reference dose amount $I_e$. As shown in FIG. 15, the mask 141 is a reference mask for obtaining a desired mask and has a pattern obtained by directly magnifying a design pattern maintaining similarity in shape. Arranged thereon are a plurality of mask patterns 141' like lines, i.e., an L/S pattern of 1:1 with a line width 0.15 μm. With use of this mask 141, an experiment or calculation is carried out to evaluate an exposure margin. Further, an optimum dose amount (or a threshold level) for transferring this L/S pattern is set as the reference dose amount $I_e$. The mask used for determining the reference dose amount $I_e$ is not limited to the L/S pattern shown in FIG. 15 but may be a mask including an L/S pattern of 1:3 or 1:4, an isolated line pattern, or the like.

Figure 16A:
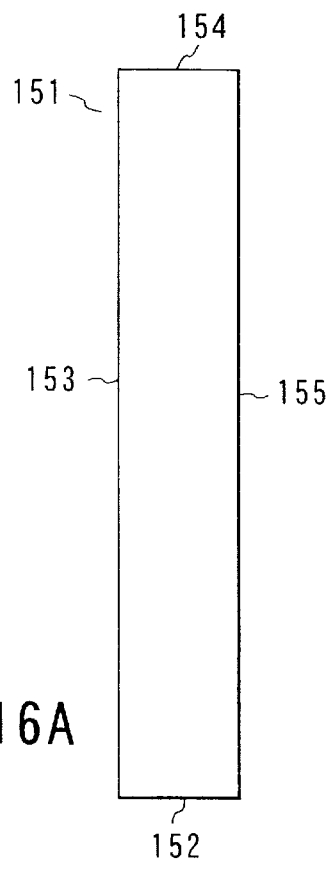
FIG. 16A is a view showing the structure of the first mask according to the embodiment.

Next, a first mask pattern as a target from which a corrected pattern is prepared is prepared (132). A specific structure of this first mask pattern 151 is shown in FIG. 16A. In FIG. 16A, the first mask pattern 151 is a pattern as a reference for obtaining a desired mask pattern and also is a pattern obtained by directly magnifying the mask pattern 141' with maintaining similarity in shape, which constitutes the mask 141 used for determining the reference dose amount $I_e$. This first mask pattern 151 is a line pattern with a line width 0.15 μm equivalently calculated on a wafer. The first mask pattern 151 also has four edges 152 to 155.

A predetermined dose amount is set with use of this first mask pattern 151 (133), and pattern transfer is carried out to obtain a finished plan shape (134). Further, the dose amount thus set is changed in steps, to obtain a finished plan shape at each dose amount (135). Then, the procedure goes to the step 136.

Figure 16B:
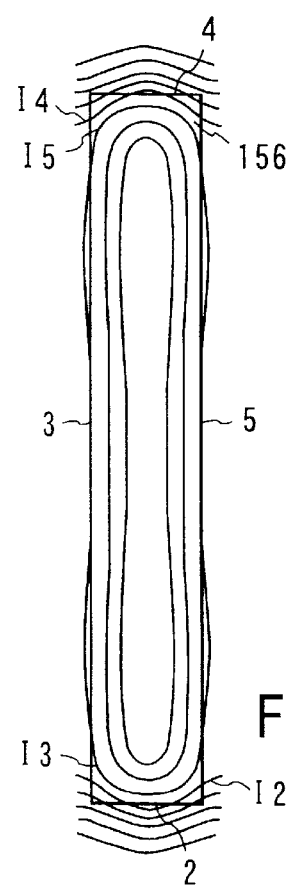
FIG. 16B is a view showing a finished plan shape transferred by the first mask while changing the dose amount, according to the embodiment.

FIG. 16B shows finished plan shapes depending on the first mask pattern 151 at respective dose amounts. As shown in FIG. 16B, the optimum dose amount at which the finished plan shape becomes equal to the design pattern 156 varies depending on the edges 152 to 155. In FIG. 16B, the references $I_2$ to $I_5$ indicate optimum dose amounts at which the finished plan shape becomes equal to the design pattern at the edges 152 to 155, respectively. In the present embodiment, the dose amounts at which the center positions of the edges 152 to 155 correspond to the edges of a finished plan shape are used as the dose amounts at which the finished plan shape becomes equal to the design pattern 156.

Figure 17A:
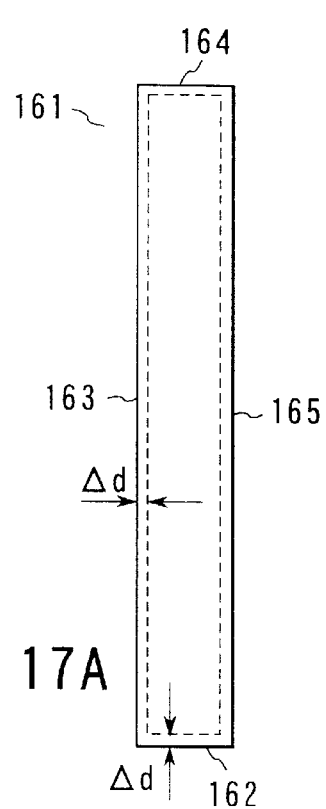
FIG. 17A is a view showing the structure of the second mask according to the embodiment.

In parallel with the determination of the optimum dose amount based on the first mask pattern 151, another finished plane shape is obtained from the second mask pattern 161 in the same manner as in the case of the first mask pattern 151, and an optimum dose amount is determined for each edge (131 to 135). A specific structure of this second mask pattern 161 is shown in FIG. 17A. As shown in FIG. 17A, the second mask pattern 161 is a pattern defined by shifting the edges 152 to 155 of the first mask pattern 151, indicated by a broken line, uniformly by $\Delta d$. This second mask pattern 161 has four edges 162 to 165.

Figure 17B:
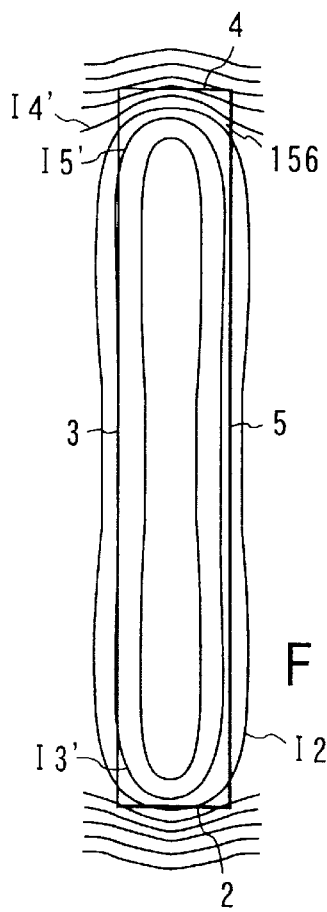
FIG. 17B is a view showing a finished plan shape transferred by the second mask while changing the dose amount, according to the embodiment.

A finished plan shape based on the second mask pattern 161 thus obtained is shown in FIG. 17B. In FIG. 17B, the references $I_2'$ to $I_5'$ indicate optimum dose amounts at which the finished plan shape becomes equal to the design pattern 156 at the edges 162 to 165, respectively. The manner of determining the optimum dose amounts is the same as that of the first mask pattern 151.

The dose difference $\Delta I_j = I_j - I_j'$ (where j corresponds to the edge number) for each edge is obtained from the optimum dose amounts I2 to I5 and I2' to I5' for the edges of the first and second mask patterns 151 and 161 obtained by the above steps. The dose difference $\Delta d$ is standardized by an edge shift amount $\Delta d$, and a correction coefficient $M_j$ indicated by the following equation (4) is calculated for each edge (136).

$$M_j = (I_j - I_j')/\Delta d \tag{4}$$

Next, this correction coefficient $M_j$ is used to prepare a corrected pattern (137). In the present embodiment, the dose difference $\Delta I_j$ is calculated for each edge, and each edge position on the first mask pattern 151 is shifted by an amount obtained by dividing the dose difference by the correction coefficient $M_j$. The edge shift amount $d_j$ is expressed by the following equation (5).

$$d_j = (I_e - I_j)/M_j \tag{5}$$

As described above, a corrected pattern is prepared in which each edge position of the first mask pattern 151 is shifted by $d_j$. With use of the corrected pattern thus obtained, transfer is carried out to calculate a finished plan shape (138). If the finished plan shape thus obtained satisfies predetermined correction accuracy (139), preparation of the corrected pattern is completed (140).

Otherwise, if the finished plan shape obtained from the corrected pattern does not satisfy predetermined correction accuracy, the dose amount is changed in steps to obtain a finished plan shape of a corrected pattern. Further, based on the finished plan shape thus obtained, the dose amounts $I_{j2}$ (where the appended figure indicates the number of corrections) at which the center positions of the edges of the design pattern become equal to the finished plan shape are calculated (141). Further, from the dose amounts $I_j$, the correction coefficient $M_j$ is calculated for each edge. Further, a new corrected pattern is prepared in which each edge position is shifted by an edge shift amount dj2 obtained from the following equation (6) with use of the correction coefficient $M_j$ (137).

$$d_{j2}=(I_e-I_{j2})/M_j \quad (6)$$

Thus, if predetermined correction accuracy is not obtained, a step of preparing a new corrected pattern obtained by further shifting each edge position of a corrected pattern by a shift amount $d_{j2}$, $d_{j3}$, $d_{j4}$, may be repeatedly carried out.

Figure 18:
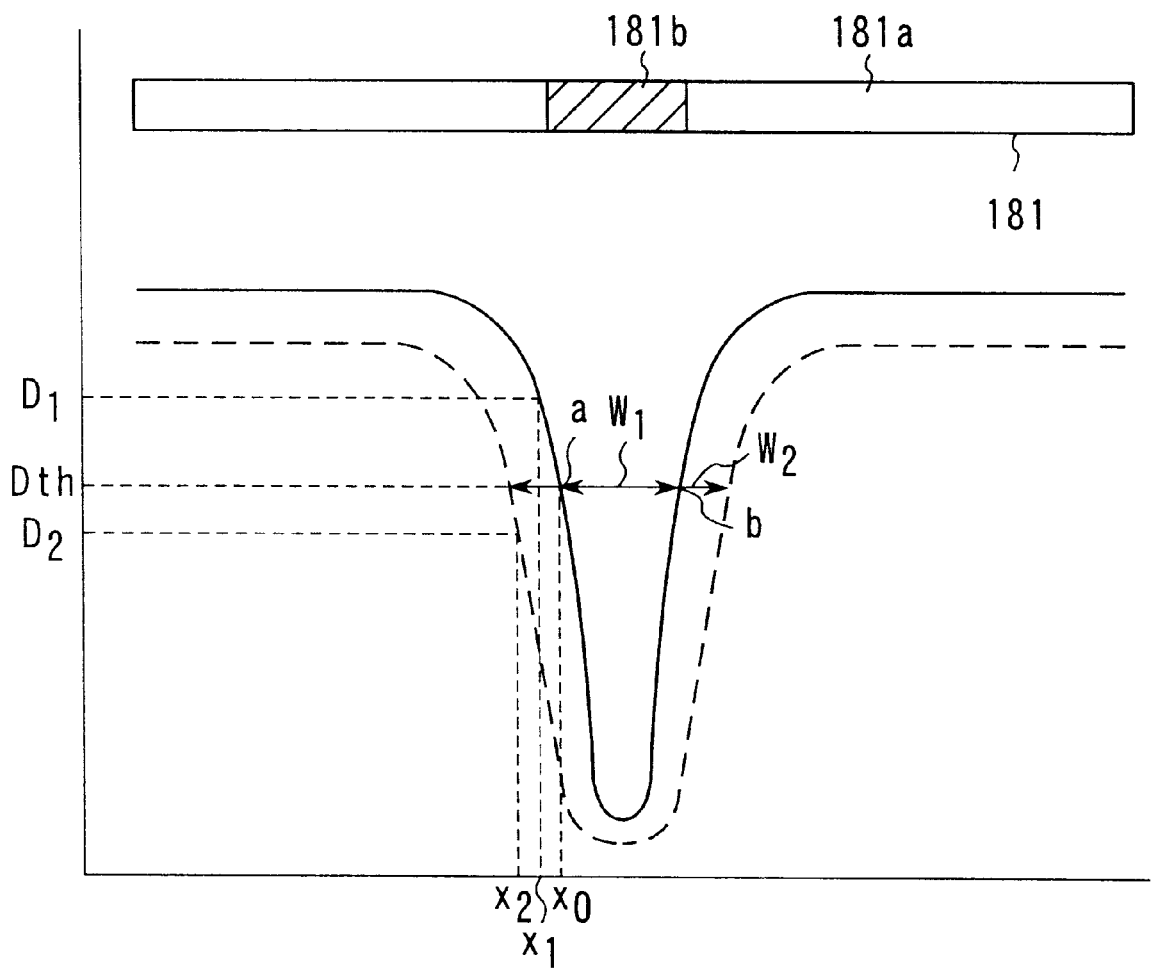
FIG. 18 is a view showing an advantage of obtaining a coefficient with use of a dose amount as a parameter.

Thus, according to the present embodiment, since the dose differences are used as parameters to calculate coefficients, calculation can be made at a higher speed than in the first to fourth embodiments which use dimensional differences as parameters. The grounds will be explained below with reference to FIG. 18. FIG. 18 shows the relationship between exposure positions and dose amounts (light intensity), together with a conceptual view of the mask 181. The mask 181 is formed of a light-transmitting pattern 181a and a light-shielding pattern 181b, and the dose amount is minimized at the position corresponding to the light-shielding pattern 181b. The continuous line indicates an dose distribution curve obtained by the first mask pattern, and the broken line indicates an dose distribution curve obtained by the second mask pattern. In cases of the first to fourth embodiments, it is necessary to obtain dimension values, and therefore, points a and b at a predetermined threshold dose amount $D_{th}$ are obtained. Further, by calculating the distance between the points a and b, the dimension value $W_1$ is obtained. Likewise, the dimension value $W_2$ is obtained by a second mask pattern obtained by slightly increasing the pattern width of the light-shielding pattern 181b.

In contrast, according to the present embodiment, it is only necessary to obtain the dose amounts $D_1$ and $D_2$ at edge positions $x_1$ and $x_2$ of the first and second mask patterns. In case where dimension values are used parameters, the distance between points corresponding to each edge is obtained. To calculate the distance between these two points, it is necessary to grasp positional relationship between these two points relative to each other. That is, one parameter is required for determining whether a dimension value is defined in the positive or negative direction with respect to a reference point. Consequently, an extra parameter is thus required, so the calculation time is elongated.

From the ground described above, the calculation time can be shortened more in the case where the dose differences are used to calculate coefficients than in the case where dimension values are used to calculate coefficients.

Figure 19A:
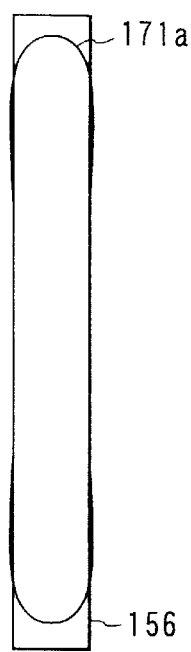
FIG. 19A is a view showing a finished plan shape transferred by a corrected pattern according to the embodiment.
Figure 19B:
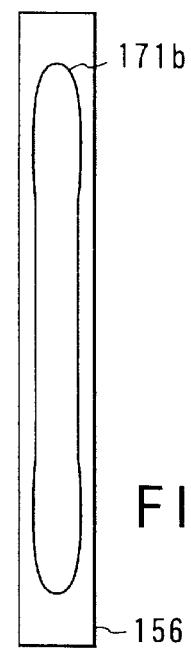
FIG. 19B is a view showing a finished plan shape transferred without making correction according to the embodiment.

A finished plan shape 171a obtained by transferring the corrected pattern at a reference dose amount $I_e$ through the above step is shown in FIG. 19A, together with a design pattern 156. For the sake of comparison, a finished plan shape transferred by a pattern not corrected is shown in FIG. 19B. As shown in FIG. 19B, the finished plan shape 171b transferred without correction has a shape narrower than the design pattern 156. In contrast, the finished plan shape 171a transferred by a corrected pattern corresponds to the edges of the design pattern 156, and thus can be found that the finished plan shape 171a has been finished substantially as desired.

Figure 20:
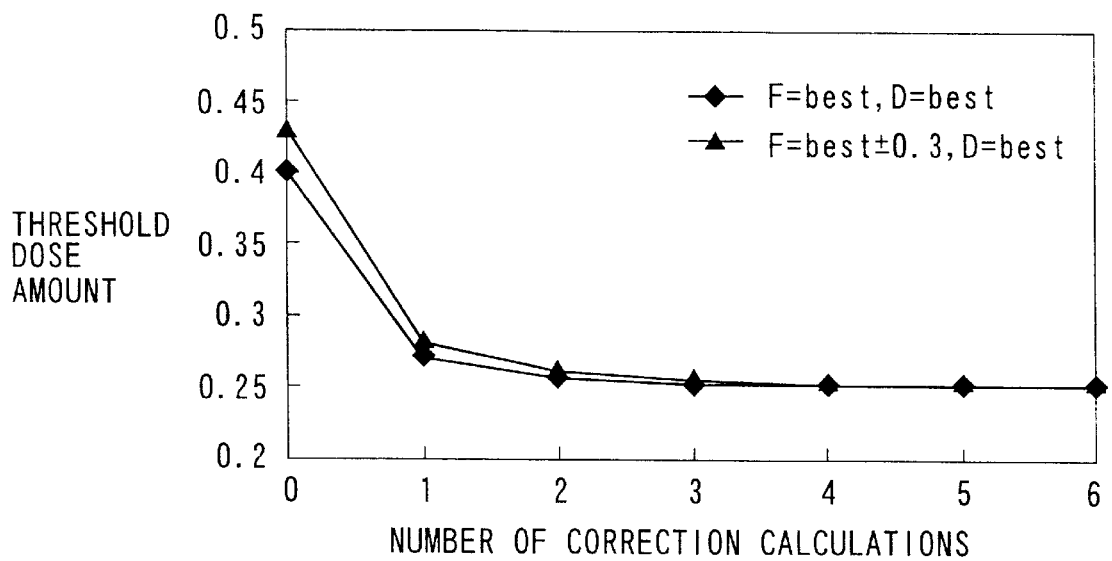
FIG. 20 is a graph showing the relationship between the number of times of correction calculations and the dose amounts in preparation of a corrected pattern according to the embodiment.

FIG. 20 shows a relationship between the number of times of correction calculations and the dose amounts in case where preparation of the corrected pattern described above was carried out by simulation. The reference dose amount was set to $I_e$=0.25 and the shift amount of each edge was set to $\Delta d$=2 nm. In addition, not only correction results in the case of the best focus but also those in the case of a defocus distance of ±0.3 µm are shown together. In the views shown below, the correction results in the case of a defocus will be shown together, likewise.

A correction method taking into consideration a finished plan shape in the case of defocus is described in SPIE Vol. 2440 (1995) 192. Thus, correction results in the case of defocus are shown because the mask dimensions after correction are determined, taking into consideration the finished shape in the case of the best focus but also the finished shape in the case of predetermined defocus. In both of the case of the best focus and the case of the defocus, it is found that the mask dimensions are converged to the reference dose amount $I_e$=0.25 by corrections for three to four times.

Figure 1:
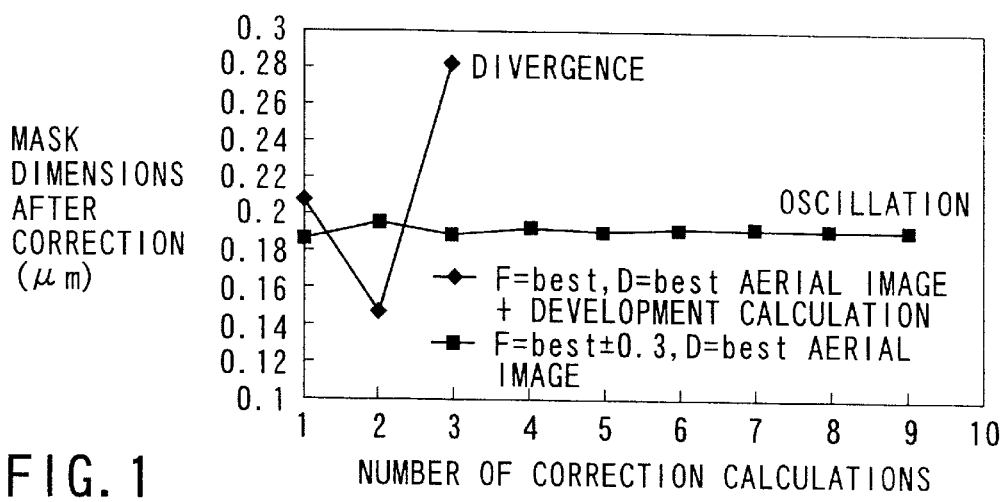
FIG. 1 is a graph showing the relationship between the number of times of the correction calculations and the mask dimensions in a conventional method for preparing a corrected pattern.
Figure 21:
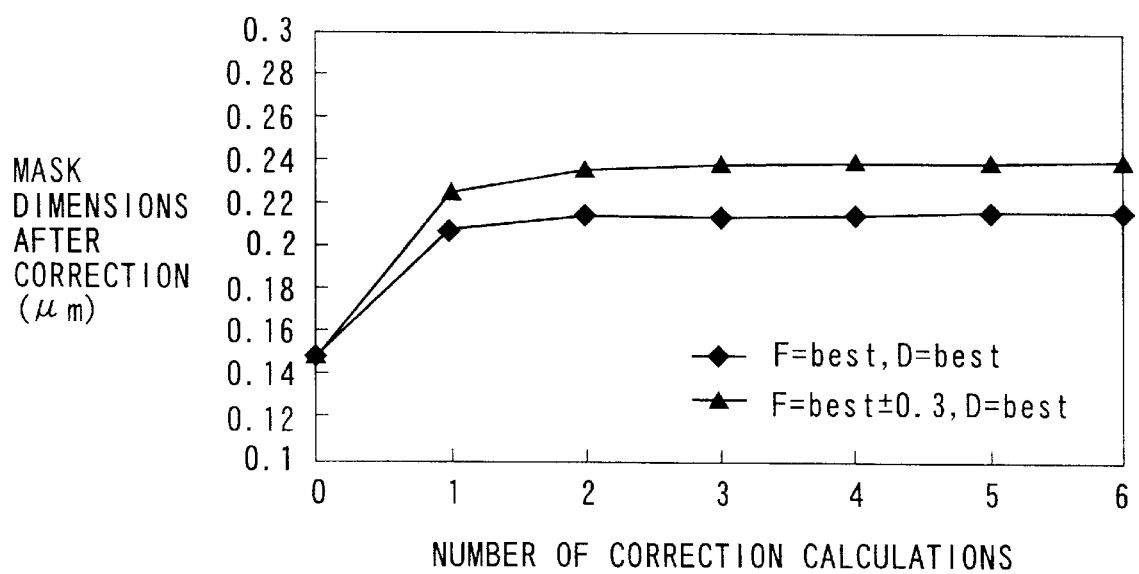
FIG. 21 is a graph showing the relationship between the number of times of correction calculations and the mask dimensions in preparation of a corrected pattern according to the embodiment.

FIG. 21 shows the relationship between the number of times of correction calculations in case where correction is made to an L/S pattern of 0.15 µm and the mask dimensions. In both the cases of the best focus and defocus, the dimensions are converged by correction calculations for two to three times. From results of this, it can be found that a time required for correction can be greatly shortened and correction with high accuracy can be achieved. This is more apparent from FIG. 1 showing the correction results based on a conventional method. Although the values of converged mask dimensions differ between the cases of the best focus and defocus, the values of the dimensions of a corrected pattern used for actual exposure are values of weighted averages or the like, but the method of determining the values of the dimensions of the corrected pattern is not limited hitherto.

Figure 22:
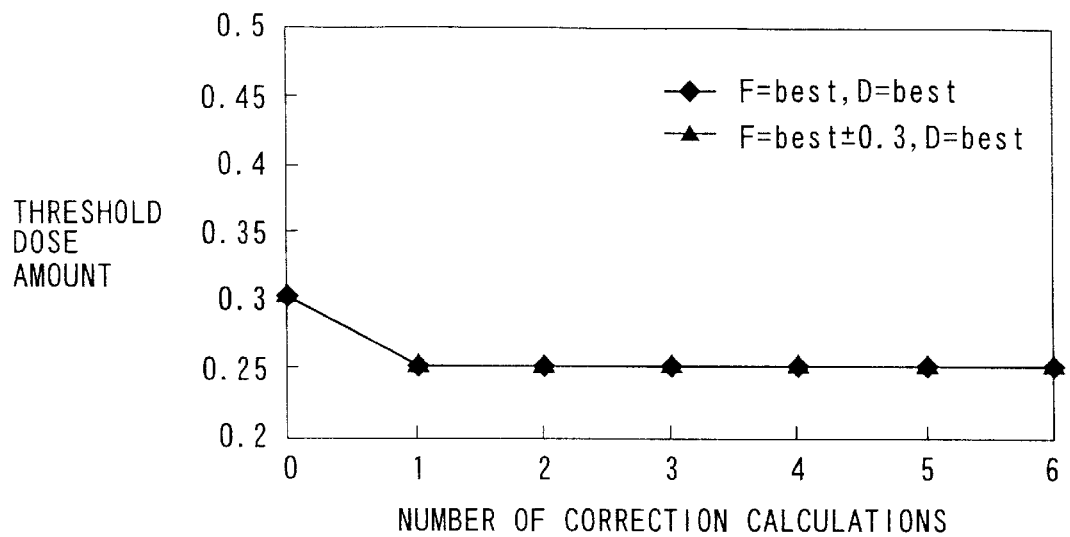
FIG. 22 is a graph showing the relationship between the number of times of correction calculations and the dose amounts in preparation of a corrected pattern according to an modification example of the embodiment.
Figure 23:
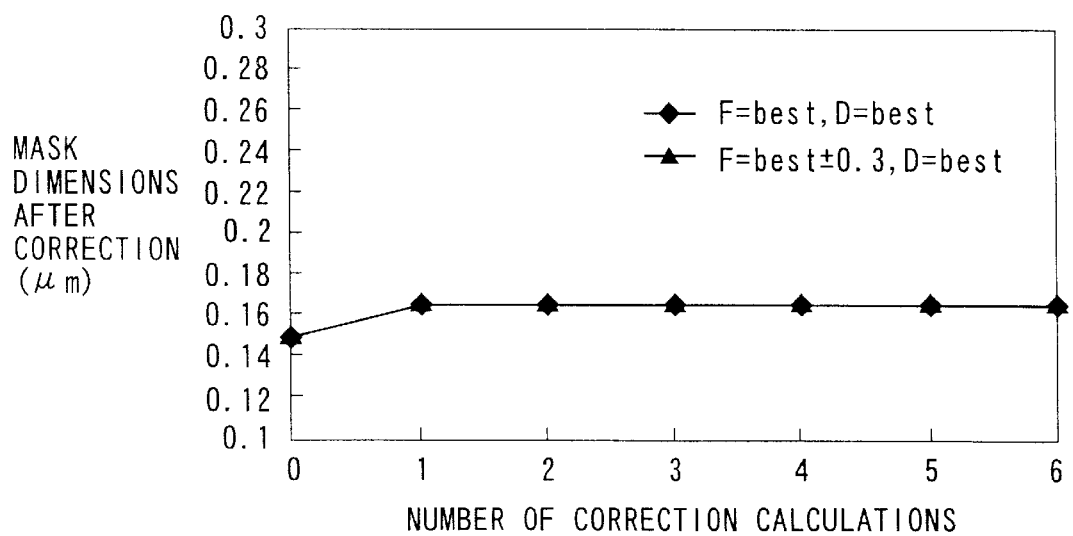
FIG. 23 is a graph showing the relationship between the number of times of correction calculations and the mask dimensions in preparation of a corrected pattern according to a modification example of the embodiment.

Next, as a modification example of the present invention, explanation will be made of a case where a corrected pattern is prepared with respect to an L/S pattern. In this modification, an L/S pattern of 1:1 at 0.15 µm is prepared as a first mask pattern in the embodiment described above. A second mask pattern obtained by shifting each edge of the first mask pattern by $\Delta d$=2 nm. The other steps are the same as those in the above embodiment. FIG. 22 shows the relationship between the number of times of correction calculations and the dose amounts in this preparation of a corrected pattern, and FIG. 23 shows the relationship between the number of times of correction calculations and the mask dimensions. The reference dose amount is set to $I_e$=0.25. As shown in FIG. 22, it is found that the number of times of correction calculations until convergence is smaller than in the case of an isolated pattern and the dose amounts are converged substantially to the reference dose amount $I_e$=0.25, for one to two times of correction calculations. Also, as shown in FIG. 23, the dimensions are converged to predetermined values of dimensions in both cases of the focus and defocus.

It is thus apparent that the present invention can be applied not only to an isolated pattern but also to an L/S pattern and the present invention is not limited by the type of the pattern such as another hole pattern or the like. The methods described in the above embodiments are merely examples in which the present invention is applied, but the present invention is widely applicable to other pattern correction methods which involve shifts of pattern edges.

In addition, the present invention is not limited to the first to fifth embodiments described above. The mask pattern 1 in the first embodiment, the mask pattern 10 in the second embodiment, the first and second mask patterns 151 and 161 in the fifth embodiment are respectively examples using mask patterns equal to design patterns, respectively. However, there actually a case where a desired finished plan shape is formed by adjusting the dose amount with use of a pattern having a shape different from a design pattern, e.g., a pattern obtained by adding a supplemental pattern to a pattern having the same shape as a design pattern, or so. In this case, if the above correction method is applied to the mask pattern, it is naturally possible to prepare a corrected mask pattern with high accuracy in a short time.

Also, it has been confirmed that correction with high accuracy can be achieved by combining the fifth embodiment with any of the second to fourth embodiments.

Also, after an image intensity calculation is combined with a model taking into consideration the influences from shifts of dimensions due to resist development or etching, the pattern can be corrected in accordance with the present invention. Also, the present invention is capable flexibly respond to differences in mask types and in exposure conditions. Although a corrected pattern is prepared by calculation in the above embodiments, a mask pattern may be actually prepared and a corrected pattern may be prepared by an experiment.

Figure 24:
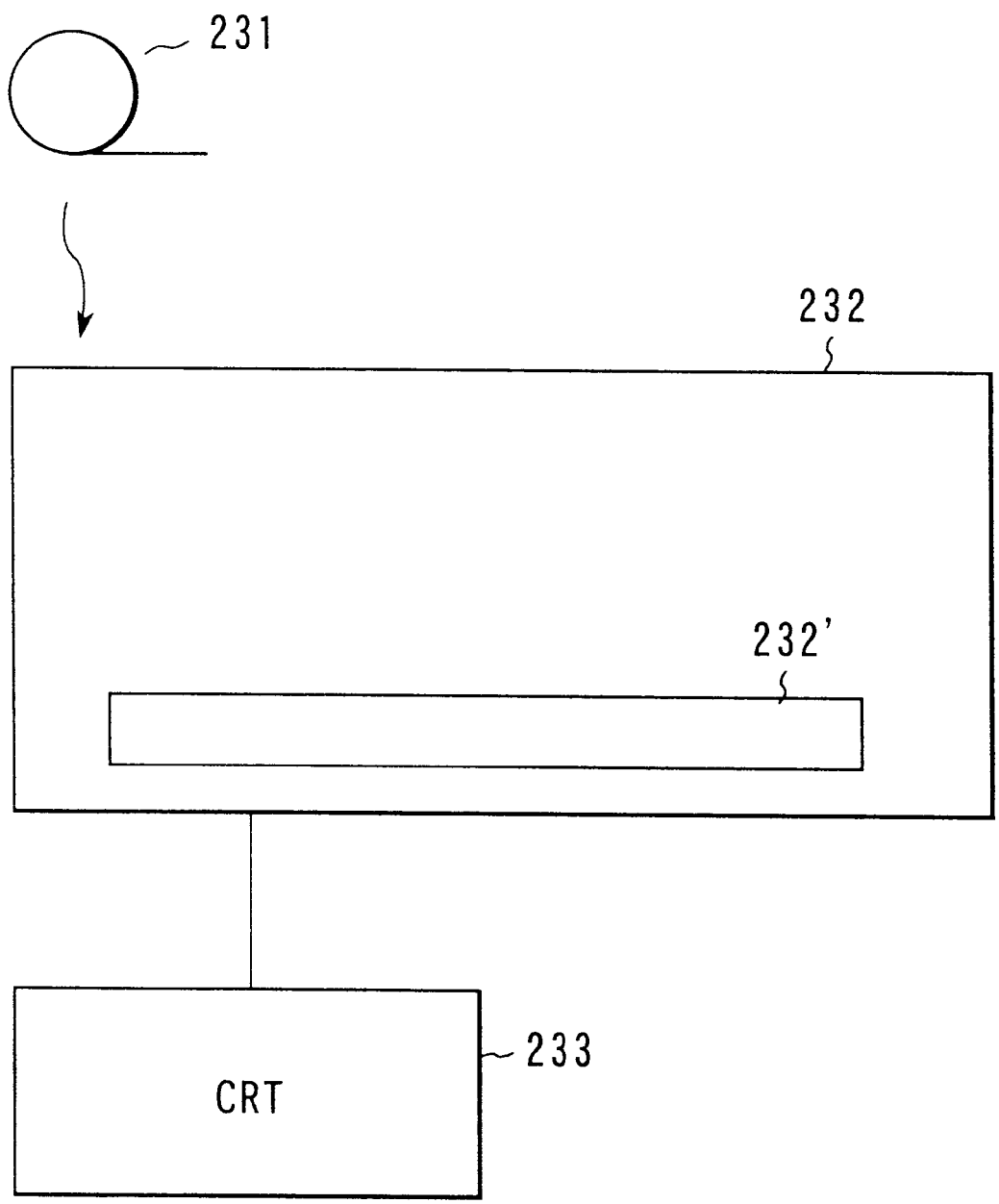
FIG. 24 is a conceptual view showing an example in case where a mask pattern correction method according to the present invention is used as a computer program.

Further, the same corrected pattern as described above can naturally be obtained by preparing the above embodiment as a computer program and by executing this program. In this case, as shown in FIG. 24, the program in the recording medium 231 is read by the computer 232, and a simulation is carried out in a state where the mask pattern correction program recording the algorithm of the above embodiment is included in the control section 232' of the computer 232. The simulation result is outputted to the monitor 233.

As has been explained above, according to the present invention, the dimensional difference between a mask pattern and a design pattern is obtained for every edge of the mask pattern. Based on the dimensional differences, correction amounts of the edges are calculated with different rates for the edges, respectively. In this manner, correction of a mask pattern can be performed in a short time with high accuracy, by a small number of times of calculations.

Also, according to another aspect of the invention, the dose amounts at which the edge positions of the mask pattern respectively become equal to the edge positions of a design pattern are obtained. Based on the differences between the dose amounts and a reference dose amount, correction amounts of the edges are calculated with different rates for the edges, respectively. In this manner, correction of a mask pattern can be performed in a short calculation time with high accuracy, by a small number of times of calculations.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A mask pattern correction method used for forming a design pattern on a wafer by a projection optical system, comprising:

a first step of preparing a second mask pattern by shifting each of positions of edges forming a first mask pattern by a predetermined change amount;

a second step of obtaining a first finished plan shape transferred by the first mask pattern, and a second finished plan shape transferred by the second mask pattern, by means of a calculation or experiment;

a third step of calculating coefficients obtained by dividing a dimensional difference between edge positions of corresponding edges of the first and second finished plan shapes, by the change amount, for every edge, and assigning the coefficients to the edges; and a fourth step of preparing a corrected pattern by shifting the edge positions of the edges of the first mask pattern in accordance with magnitude of division of differences between the design pattern and the first finished plan shapes, by the coefficients assigned to the edges.

2. A mask pattern correction method according to claim 1, further comprises:

a step of preparing a new corrected pattern by shifting the edge positions of the corrected pattern in accordance with magnitude of division of differences between the design pattern and the finished plan shape of the corrected pattern by the coefficients assigned to the edges, the step being repeated until dimensional differences between edge positions of corresponding edges of the design pattern and a plan shape depending on the corrected pattern satisfy a predetermined tolerance.

3. A mask pattern correction method according to claim 1, wherein the dimensional differences between the edge positions are respectively dimensional differences at the center positions of the edges.

4. A mask pattern correction method according to claim 1, wherein the edges are previously divided into edge segments each having a predetermined length obtained by multiplying a grid size of a mask drawing device by an integer, and the dimensional differences and the coefficients are calculated for every edge segments.

5. A mask pattern correction method according to claim 1, wherein the coefficients are calculated in consideration of an influence which a shift of a part of an edge position makes on a dimensional change of another edge position, by preparing a plurality of second mask patterns each obtained by shifting a part of the plurality of edge positions constituting the first mask pattern by a predetermined change amount.

6. A mask pattern correction method used for forming a design pattern on a wafer by a projection optical system, wherein a corrected pattern is prepared by individually shifting a position of each of edges of the first mask pattern such that first dose amounts, at which edge positions of a finished plan shape transferred by a first mask pattern respectively become equal to edge positions of the design pattern, become equal to a predetermined reference dose amount.

7. A mask pattern correction method according to claim 6, wherein a step of shifting the edge positions of the first mask pattern comprises:

a step of preparing a second mask pattern by shifting the edge positions constituting the first mask pattern by a predetermined change amount;

a step of obtaining a first finished plan shape transferred by the first mask pattern, and a second finished plan shape transferred by the second mask pattern, while changing an dose amount; and a step of obtaining the first dose amounts and second dose amounts at which edge positions of the second finished plan shape respectively become equal to the edge positions of the design pattern, respectively for edges, of calculating and assigning coefficients obtained by dividing differences between the first and second exposures to the edges, respectively, and of shifting the edge positions of the first mask pattern in accordance with magnitude of division of differences between the first dose amounts and the reference dose amount by the coefficients, respectively.

8. A mask pattern correction method according to claim 6, further comprising a step of preparing a new corrected pattern by shifting edge positions of the corrected pattern in accordance with magnitude of division of differences between the reference dose amounts and dose amounts of a finished plan shape transferred by the corrected pattern at the edge position of the design pattern, by the coefficients, respectively, the step being repeated until dose differences between the reference dose amounts and the first dose amounts satisfy a predetermined tolerance.

9. A mask pattern correction method according to claim 6, wherein the dose amounts at which the edge positions of the finished plan shape become equal to the edge positions of the design pattern are determined with reference to centered edge position, respectively.

10. A mask pattern correction method according to claim 6, wherein the edges are previously divided into edge segments each having a predetermined length obtained by multiplying a drawing grid width of a mask drawing device by an integer, and the dose differences and the coefficients are calculated for every edge segments.

11. A mask pattern correction method according to claim 6, wherein the coefficients are calculated in consideration of an influence which a shift of a part of an edge position makes on a dimensional change of another edge position, by preparing a plurality of second mask patterns each obtained by shifting only a part of the plurality of edge positions constituting the first mask pattern by a predetermined change amount.

12. A recording medium recording a mask pattern correction program for realizing a function of correcting a mask pattern used for forming a design pattern on a wafer by a projection optical system, the mask pattern correction program being used for realizing:

a function of preparing a second mask pattern by shifting each of positions of edges forming a first mask pattern by a predetermined change amount;

a function of obtaining a first finished plan shape transferred by the first mask pattern, and a second finished plan shape transferred by the second mask pattern; and a function of preparing a corrected pattern by shifting the edge positions of the edges of the first mask pattern by amounts based on parameters obtained by or used for transfer of the first and second mask patterns, and the change amount, to each edge.

13. A recording medium according to claim 12, wherein the parameters are respectively dimensional differences between corresponding edges of the first and second finished plan shapes.

14. A recording medium according to claim 12, wherein the parameters are respectively differences between first dose amounts, at which edge positions of a first finished plan shape become respectively equal to the edge positions of the design pattern, and second dose amounts, at which edge positions of a second finished plan shape become respectively equal to the edge positions of the design pattern.

* * * * *

UNITED STATES PATENT AND TRADEMARK OFFICE
CERTIFICATE OF CORRECTION

PATENT NO.   : 6,221,539 B1  
DATED        : April 24, 2001  
INVENTOR(S)  : Toshiya Kotani et al.

Page 1 of 1

It is certified that error appears in the above-identified patent and that said Letters Patent is hereby corrected as shown below:

<u>Title page,</u>  
Item [57], ABSTRACT, line 4, "fist" should read -- first --.

<u>Column 14, claim 4,</u>  
Line 35, "every edge segments" should read -- every edge segment --.

<u>Column 14, claim 7,</u>  
Line 65, "an dose" should read -- a dose --.

<u>Column 15, claim 10,</u>  
Line 33, "every edge segments" should read -- every edge segment --.

Signed and Sealed this

Second Day of April, 2002

Attest:

Attesting Officer

JAMES E. ROGAN  
Director of the United States Patent and Trademark Office